US010886364B2

(12) United States Patent
Yang et al.

(10) Patent No.: US 10,886,364 B2
(45) Date of Patent: Jan. 5, 2021

(54) VERTICAL MEMORY CELL WITH MECHANICAL STRUCTURAL REINFORCEMENT

(71) Applicant: International Business Machines Corporation, Armonk, NY (US)

(72) Inventors: Adam Yang, Fishkill, NY (US); Choong Ho Lee, Fishkill, NY (US); Elnatan Mataev, Beacon, NY (US); Jonathan Fry, Fishkill, NY (US); Cheng-Yi Lin, Hopewell Junction, NY (US); Bharat Biyani, Wappingers Falls, NY (US); Jang Sim, Dutchess, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 26 days.

(21) Appl. No.: 15/889,514

(22) Filed: Feb. 6, 2018

(65) Prior Publication Data

US 2019/0245032 A1    Aug. 8, 2019

(51) Int. Cl.
*H01L 29/06* (2006.01)
*H01L 27/11556* (2017.01)
(Continued)

(52) U.S. Cl.
CPC ...... *H01L 29/0603* (2013.01); *H01L 21/0217* (2013.01); *H01L 21/02164* (2013.01);
(Continued)

(58) Field of Classification Search
CPC ......... H01L 27/11504; H01L 27/11519; H01L 27/11565
See application file for complete search history.

(56) References Cited

U.S. PATENT DOCUMENTS 9,466,579 B2    10/2016 Hochstenback et al.
9,548,313 B2    1/2017 Yada et al.
(Continued)

FOREIGN PATENT DOCUMENTS

CN    106653684 A    5/2017

OTHER PUBLICATIONS

Micheloni, R., Crippa, L., Zambelli, C. et al. (2017). Architectural and Integration Options for 3D NAND Flash Memories. Computers, 6, No. 3, 27: See entire article, including sections "7. TCAT Architecture" and "8. V-NAND Architecture."
(Continued)

*Primary Examiner* — John A Bodnar
(74) *Attorney, Agent, or Firm* — Cantor Colburn LLP; Steven Meyers

(57) ABSTRACT

A reinforced vertical-NAND structure is provided. The reinforced vertical-NAND structure includes a first set of interleaved oxide and nitride layers formed into first and second vertical structures. The first vertical structure rises from a first section of a substrate and the second vertical structure rises from a second section of the substrate. The reinforced vertical-NAND structure also includes a reinforcing layer and a second set of interleaved oxide and nitride layers formed into third and fourth vertical structures. The reinforcing layer includes sheets, which are distinct and laid across respective tops of the first and second vertical structures, and bridges connecting the sheets. The third vertical structure rises from the sheet corresponding to the first vertical structure and the fourth vertical structure rises from the sheet corresponding to the second vertical structure.

10 Claims, 8 Drawing Sheets

(51) Int. Cl.
H01L 21/02 (2006.01)
H01L 21/311 (2006.01)

(52) U.S. Cl.
CPC .. *H01L 21/02178* (2013.01); *H01L 21/02181* (2013.01); *H01L 21/31111* (2013.01); *H01L 21/31116* (2013.01); *H01L 27/11556* (2013.01)

(56) References Cited

U.S. PATENT DOCUMENTS

| | | | |
|---|---|---|---|
| 9,576,967 B1* | 2/2017 | Kimura | H01L 27/11565 |
| 9,653,311 B1 | 5/2017 | Ahn et al. | |
| 9,698,153 B2 | 7/2017 | Liu et al. | |
| 9,786,496 B2 | 10/2017 | Van Schravendijk et al. | |
| 9,786,676 B2 | 10/2017 | Yun et al. | |
| 9,831,266 B2 | 11/2017 | Kai et al. | |
| 2010/0052042 A1* | 3/2010 | Tanaka | H01L 21/8221 257/324 |
| 2012/0003828 A1 | 1/2012 | Chang et al. | |
| 2014/0264525 A1 | 9/2014 | Takahashi et al. | |
| 2014/0299931 A1* | 10/2014 | Choi | H01L 29/66833 257/324 |
| 2015/0287479 A1 | 10/2015 | Nam et al. | |
| 2016/0049421 A1 | 2/2016 | Zhang et al. | |
| 2018/0025952 A1 | 1/2018 | Measor et al. | |

OTHER PUBLICATIONS

ISR/WO Mailed May 13, 2019, PCT Application No. PCT/IB2019/050342, 9 pages.

Anonymous et al., "Alumina (Aluminum Oxide, Al2O3", online retrieved Aug. 30, 2017, URL:<http://www.makeitfrom.com/material-properties/Alumina-Aluminum-Oxide-Al2O3, 3 pages.

Jang et al., "Vertical Cell Array using TCAT(Terabit Cell Array Transistor) Technology for Ultra High Density NAND Flash Memory", 2009, Symposium on VLSI Technology Digest of Technical Papers, 2 pages.

Katsumata et al., "Pipe-shaped BiCS Flash Memory with 16 Stacked Layers and Multi-Level-Cell Operation for Ultra High Density Storage Devices", 2009, Symposium on VLSI Technology Digest of Technical Papers, 2 pages.

Ruchiusha, "07. flash memory technology", published Oct. 4, 2012, URL:<https://www.slideshare.net/ruchiusha/07flash-memory-technology>, 51 pages.

* cited by examiner

FIG. 4A
FIG. 4B
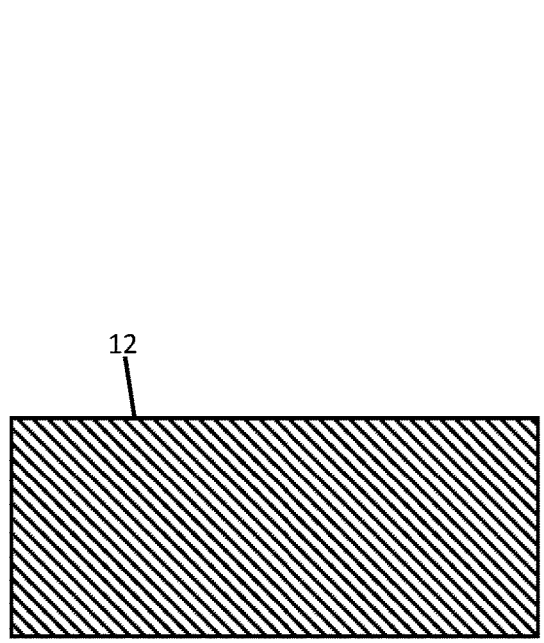
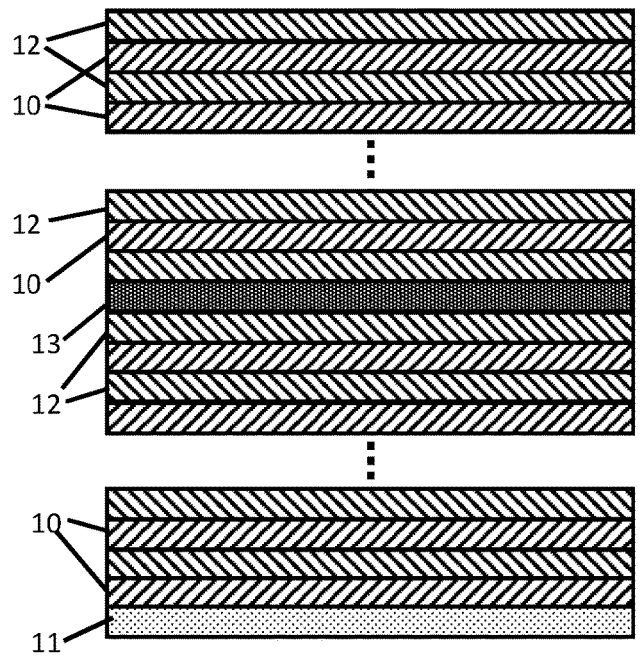
FIG. 5A
FIG. 5B
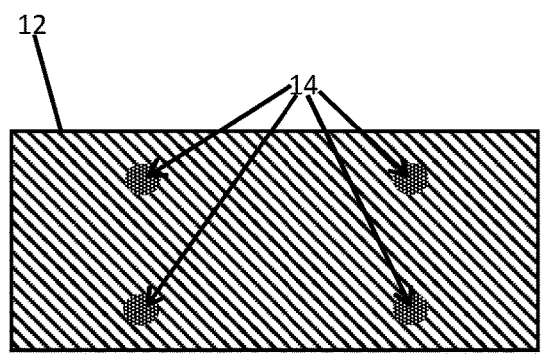
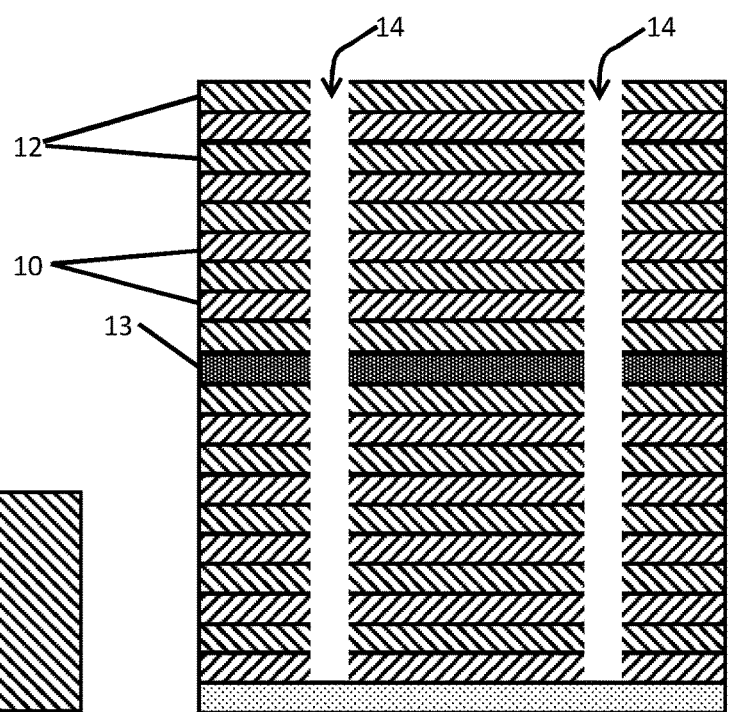

FIG. 6A
FIG. 6B
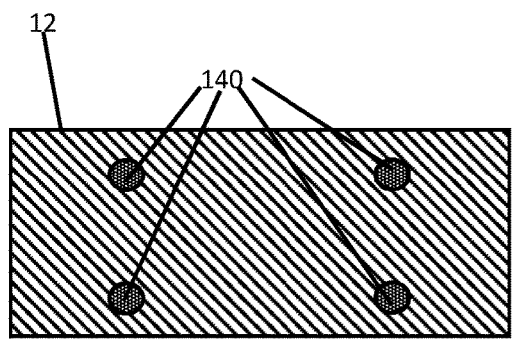
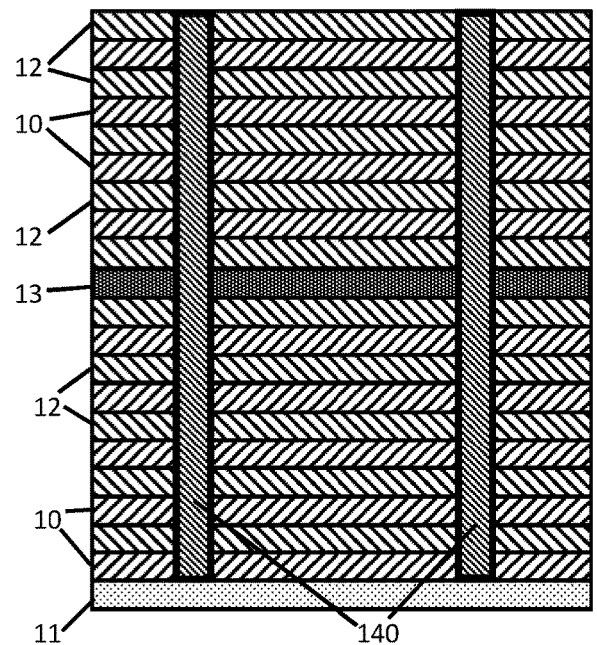
FIG. 7A
FIG. 7B
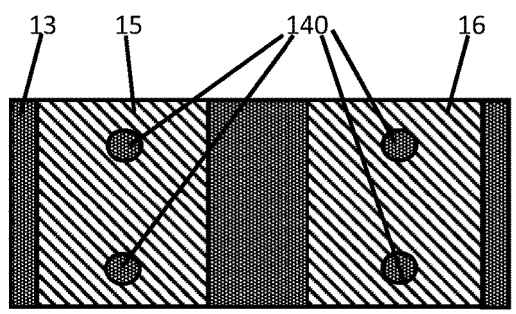
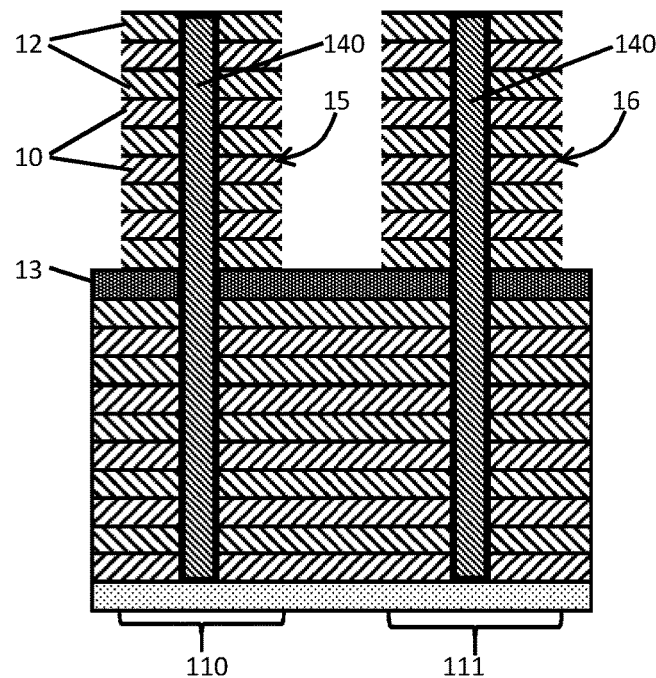

FIG. 8A
FIG. 8B
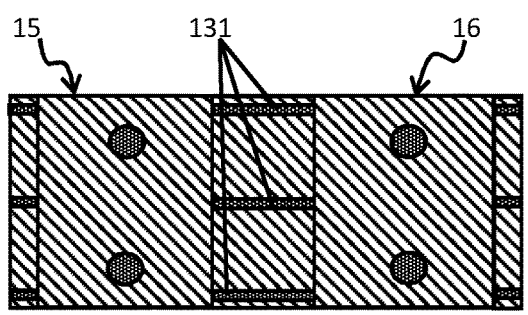
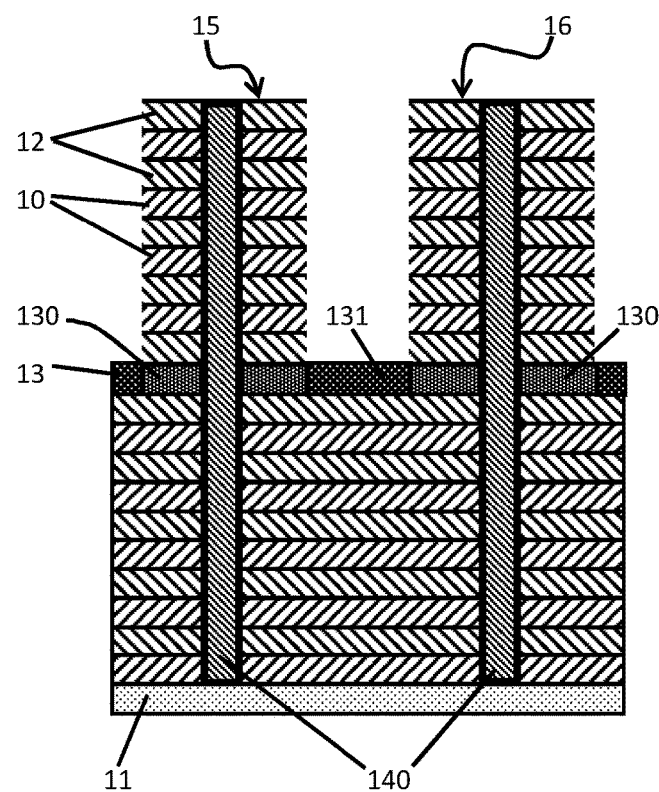

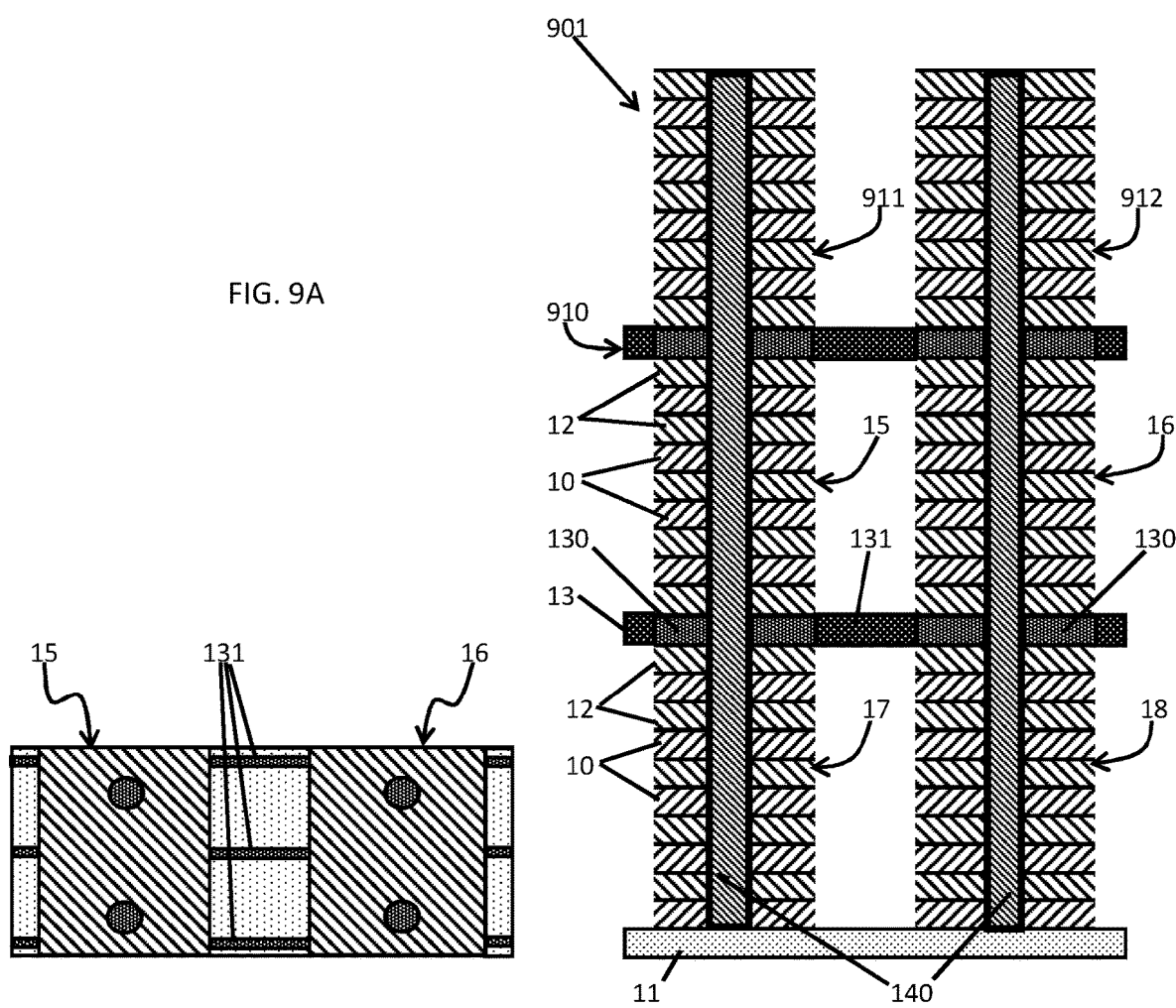

FIG. 12A
FIG. 12B
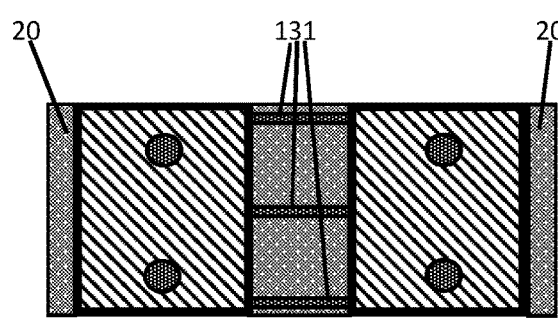
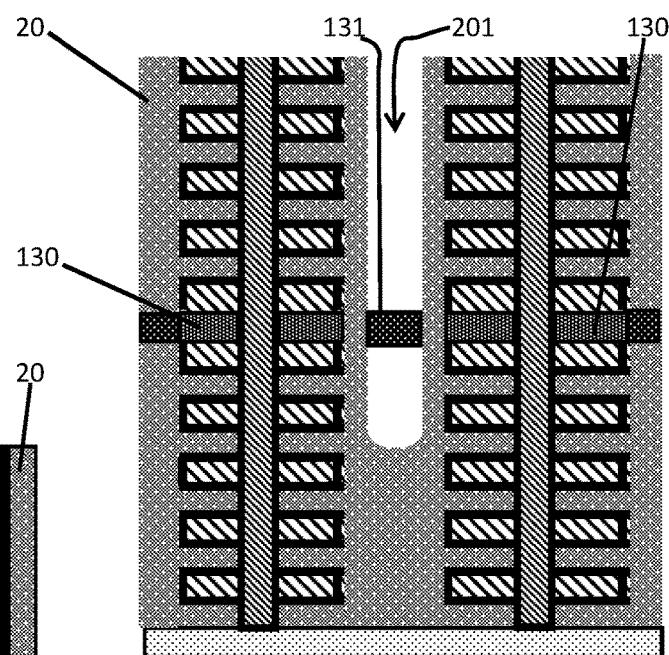

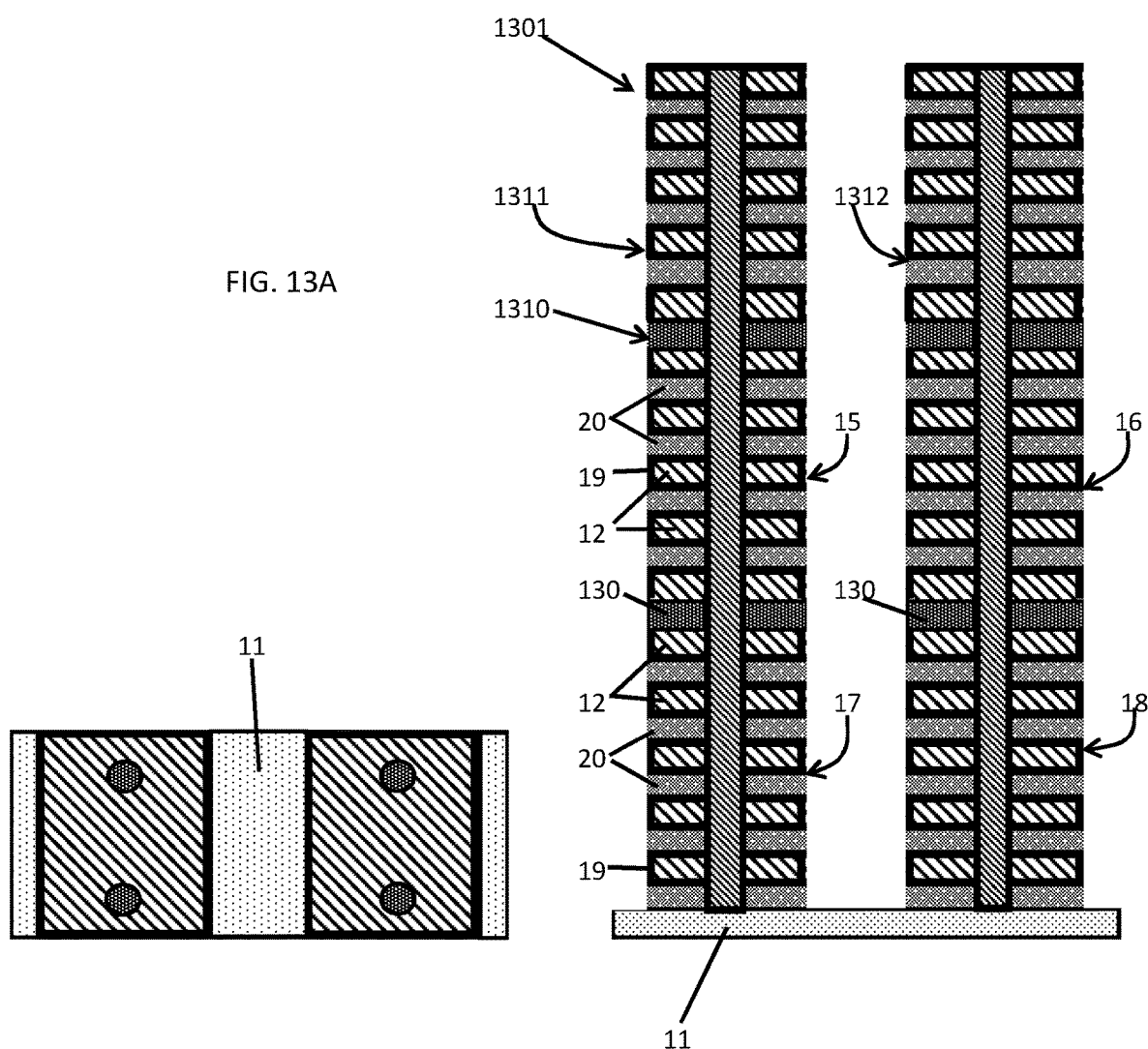

VERTICAL MEMORY CELL WITH MECHANICAL STRUCTURAL REINFORCEMENT

BACKGROUND

The present invention generally relates to memory and more specifically to VNAND memory cells with mechanical structural reinforcement.

Flash memory is very portable and combined with its other characteristics of durability and speed is useful for storing massive quantities of data. Flash memory is made up of an array of cells which record one or several bits (zeroes or ones). Each cell includes floating gate transistors that trap an electrical charge to indicate the one or zero. Single-level cells (SLC) store one bit, multi-level cells (MLC) store two bits, triple-level cells (TLC) store three bits and quad-level cells (QLC) store four bits. With the increase in levels, there is a decrease in cost but also a decrease in the number of program/erase cycles.

There are generally two types of flash memory: NOR and NAND referring to the logic gates used in the memory cells. NOR based flash memory has the advantages of each byte being individually readable, writeable and erasable and can often be read faster than NAND. However, NOR based flash memory is more expensive than NAND and around 60% less dense than the NAND equivalent. NOR based flash memory is mainly found embedded in devices such as mobile phones and small appliances. NAND based flash memory is currently used in solid state devices (SSDs) in particular. In NAND, hundreds to thousands of cells are arranged on pages and there are multiple pages on a single block (128 KB+). A chip includes multiple blocks. A degree of block management is required for writing and erasing data, and data can only be read on a page basis, making it somewhat unsuitable for the byte level random access required of ROM but useful for sequential access. NAND has better endurance than NOR (reportedly up to 10 times), has faster write and erase speeds owing to the way data is organized in blocks and is less expensive.

Vertical NAND (V-NAND or 3D V-NAND) refers to a technology where planar NAND based flash memory including single planes of NAND cells are stacked vertically. This vertical arrangement of cells results in increased memory capacities at lower production costs, half the power requirements, twice the speed and ten times the longevity of planar NAND.

SUMMARY

According to one or more embodiments, a reinforced vertical-NAND structure is provided. The reinforced vertical-NAND structure includes a first set of interleaved oxide and nitride layers formed into first and second vertical structures. The first vertical structure rises from a first section of a substrate and the second vertical structure rises from a second section of the substrate. The reinforced vertical-NAND structure also includes a reinforcing layer and a second set of interleaved oxide and nitride layers formed into third and fourth vertical structures. The reinforcing layer includes sheets, which are distinct and laid across respective tops of the first and second vertical structures, and bridges connecting the sheets. The third vertical structure rises from the sheet corresponding to the first vertical structure and the fourth vertical structure rises from the sheet corresponding to the second vertical structure.

According to one or more embodiments, a reinforced vertical-NAND structure is provided. The reinforced vertical-NAND structure includes a first set of interleaved lined oxide and metallic layers formed into first and second vertical structures, a reinforcing layer and a second set of interleaved lined oxide and metallic layers formed into third and fourth vertical structures. The first vertical structure rises from a first section of a substrate and the second vertical structure rises from a second section of the substrate. The reinforcing layer includes sheets, which are distinct and laid across unlined upper oxide surfaces of respective tops of the first and second vertical structures. The third vertical structure rises from the sheet corresponding to the first vertical structure and the fourth vertical structure rises from the sheet corresponding to the second vertical structure.

According to one or more embodiments, a method of assembling a reinforced-NAND structure is provided. The method includes forming a first set of interleaved oxide and nitride layers formed into first and second vertical structures rising from first and second sections of a substrate, respectively. The method also includes forming a reinforcing layer that includes sheets, which are distinct and laid across respective tops of the first and second vertical structures, and bridges connecting the sheets. In addition, the method includes forming a second set of interleaved oxide and nitride layers into third and fourth vertical structures rising from the sheets corresponding to the first and second vertical structures, respectively.

According to one or more embodiments, a method of assembling a reinforced-NAND structure is provided. The method includes building, on first and second sections of a substrate, a structure including a reinforcing layer interposed between first and second sets of interleaved oxide and nitride layers, etching portions of the second set of interleaved oxide and nitride layers between the first and second sections of the substrate, etching the reinforcing layer to form distinct sheets and bridges between the distinct sheets and etching portions of the first set of interleaved oxide and nitride layers between the first and second sections of the substrate.

According to one or more embodiments, a method of assembling a reinforced-NAND structure is provided. The method includes alternately depositing oxide and nitride on a substrate to form interleaved oxide and nitride layers, depositing reinforcing layer material on an uppermost oxide layer to form a reinforcing layer, alternately depositing oxide and nitride on the reinforcing layer to form interleaved oxide and nitride layers, forming poly-silicon lined oxide posts through the oxide, nitride and reinforcing layers, etching portions of the oxide and nitride layers above the reinforcing layer down to the reinforcing layer etching exposed portions of the reinforcing layer into bridges and etching portions of the oxide and nitride layers below the reinforcing layer down to the substrate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4A is a top view of an oxide layer deposited on interleaved oxide and nitride layers over the reinforcing layer in accordance with embodiments of the invention;

FIG. 4B is a side view of the interleaved oxide and nitride layers above and below the reinforcing layer in accordance with embodiments of the invention;

FIG. 5A is a top view of holes etched through the interleaved oxide and nitride layers above and below the reinforcing layer and through the reinforcing layer in accordance with embodiments of the invention;

FIG. 5B is a side view of the holes in accordance with embodiments of the invention;

FIG. 6A is a top view of the holes having been filled with oxide and lined with poly-silicon in accordance with embodiments of the invention;

FIG. 6B is a side view of the filled and lined holes in accordance with embodiments of the invention;

FIG. 7A is a top view of third and fourth vertical structures formed from an etching process executed with respect to the interleaved oxide and nitride layers above the reinforcing layer in accordance with embodiments of the invention;

FIG. 7B is a side view of the third and fourth vertical structures in accordance with embodiments of the invention;

FIG. 8A is a top view of bridges formed from the reinforcing layer in accordance with embodiments of the invention;

FIG. 8B is a side view of discrete sheets and the bridges in accordance with embodiments of the invention;

FIG. 9A is a top view of first and second vertical structures formed from an etching process executed with respect to the interleaved oxide and nitride layers below the reinforcing layer in accordance with embodiments of the invention;

FIG. 9B is a side view of the first and second vertical structures in accordance with embodiments of the invention;

FIG. 12A is a top view of the first-fourth vertical structures following metallic deposition around the lined oxide layers in accordance with embodiments of the invention;

FIG. 12B is a side view of the first-fourth vertical structures following metallic deposition around the lined oxide layers in accordance with embodiments of the invention;

FIG. 13A is a top view of the first-fourth vertical structures following an etching of the deposited metal and the bridges in accordance with embodiments of the invention;

FIG. 13B is a side view of the first-fourth vertical structures following an etching of the deposited metal and the bridges in accordance with embodiments of the invention;

Figure 1A:
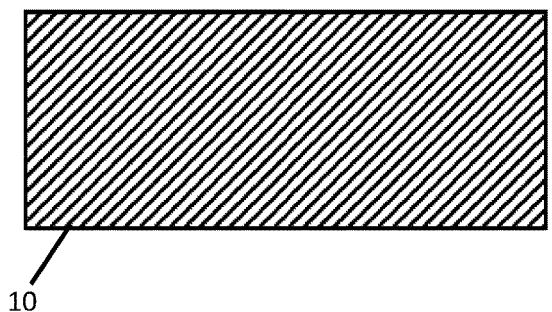
FIG. 1A is a top view of a nitride layer deposited on a substrate in accordance with embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. Accordingly, in the interest of brevity, many conventional implementation details are only mentioned briefly herein or are omitted entirely without providing the well-known system and/or process details.

Turning now to an overview of technologies that are more specifically relevant to aspects of the invention, current VNAND process flows are often limited to a number of stack layers based on structural stability during high aspect ratio wet etch/deep trench processing. Common failures include fractures in the middle of the wordline (WL) or the collapse of the WL into another if there are too many stack layers. This limits the maximum as well as the manufacturable size of the WL to around 64 bits.

Turning now to an overview of the aspects of the invention, one or more embodiments of the invention address the above-described shortcomings of the prior art by providing for robust structural designs and process windows that greatly increase the viability of embedded VNAND structures. The embodiments make use of reinforcing materials that can be selectively etched relative to materials of the VNAND structures as reinforcements between groups of bits on a bitline. These reinforcing materials can include, but are not limited to, silicon oxide, silicon nitride, hafnium oxide, aluminum oxide and beryllium oxide. The reinforcing material does not require a liner and is compatible with a single-chemical vapor deposition (single-CVD) processing sequence and a single etch sequence assembly. The reinforcing material can be electrically insulated at least with respect to the stack, has a relatively high Young's modulus at least with respect to materials in the stack and can provide relatively stiff mechanical support given its thickness.

Turning now to a more detailed description of aspects of the present invention, a process of forming a reinforced VNAND structure will now be described. It is to be understood that, while this description will refer to various features as being singular or unitary features, those various features can be formed of multiple layers, parts and composites.

Figure 1B:
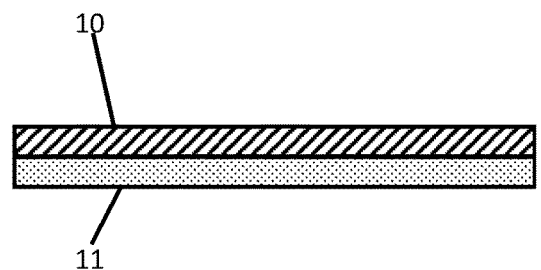
FIG. 1B is a side view of the nitride layer in accordance with embodiments of the invention.

With reference to FIGS. 1A and 1B, a nitride layer 10 is deposited as a sheet on an upper surface of a substrate 11.

Figure 2A:
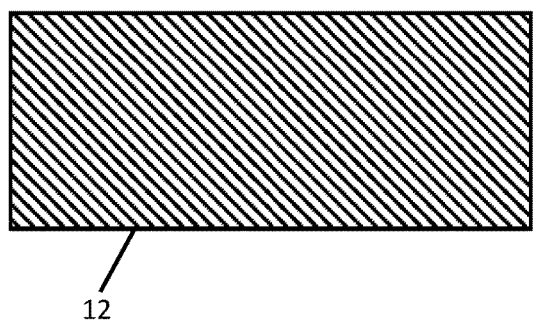
FIG. 2A is a top view of an oxide layer deposited on the nitride layer in accordance with embodiments of the invention.
Figure 2B:
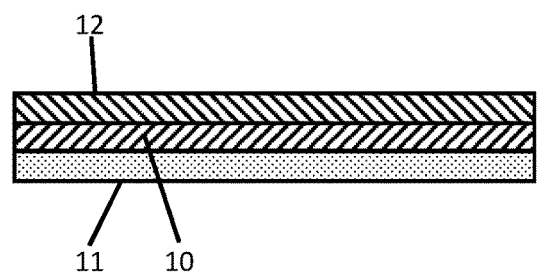
FIG. 2B is a side view of the oxide layer in accordance with embodiments of the invention.

With reference to FIGS. 2A and 2B, an oxide layer 12 is deposited as a sheet on an upper surface of the nitride layer 10.

Figure 3A:
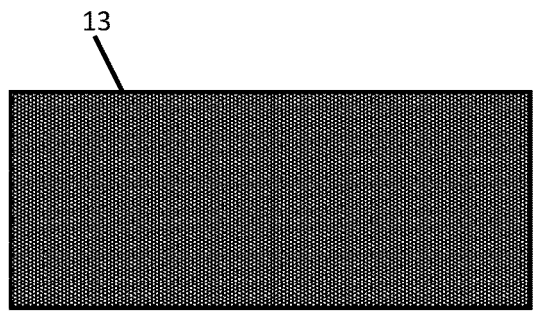
FIG. 3A is a top view of a reinforcing layer deposited on interleaved oxide and nitride layers in accordance with embodiments of the invention.
Figure 3B:
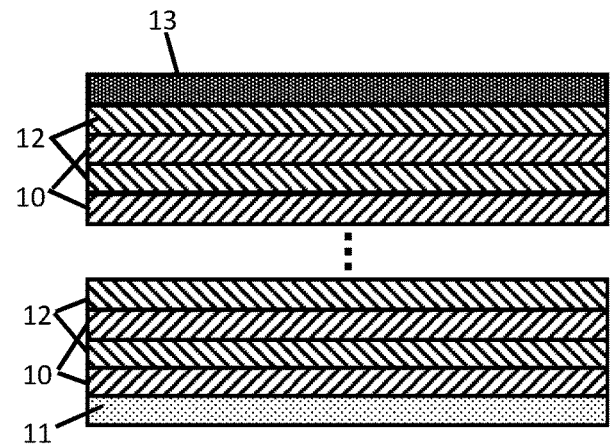
FIG. 3B is a side view of the reinforcing layer and the interleaved oxide and nitride layers in accordance with embodiments of the invention.

With reference to FIGS. 3A and 3B, multiple nitride layers 10 and oxide layers 12 are deposited over the original nitride layer 10 and the oxide layer 12 to build up a structure with a first set of n interleaved nitride layers 10 and oxide layers 12. A reinforcing layer 13 is then deposited on an uppermost one of the oxide layers 12. The reinforcing layer 13 can be formed of a material that is selectively etched with respect to at least the nitride layers 10 and the oxide layers 12. The material of the reinforcing layer 13 can have a relatively high Young's modulus and be electrically insulated at least with respect to the nitride layers 10 and the oxide layers 12. In particular, the reinforcing layer 13 can be formed of one or more of silicon oxide, silicon nitride, hafnium oxide, aluminum oxide and beryllium oxide.

With reference to FIGS. 4A and 4B, multiple nitride layers 10 and oxide layers 12 are deposited over the reinforcing layer 13 to continue to build up the structure with a second set of n interleaved nitride layers 10 and oxide layers 12.

With reference to FIGS. 5A and 5B, through-holes 14 are etched through the second set of n interleaved nitride layers 10 and oxide layers 12 above the reinforcing layer 13, through the reinforcing layer 13 and through the first set of n interleaved nitride layers 10 and oxide layers 12 below the reinforcing layer 13 to the upper surface of the substrate 11. The etching can be conducted as one of various processes including, but not limited to, a reactive ion etch (RIE), a wet etch, a plasma induced etch, etc. In any case, the etching can be executed in sequence such that the second set of n interleaved nitride layers 10 and oxide layers 12 above the reinforcing layer 13 are subjected to the RIE first, the reinforcing layer 13 is subjected to the RIE next and the first set of n interleaved nitride layers 10 and oxide layers 12 below the reinforcing layer 13 are subjected to the RIE last.

The through-holes 14 can be grouped into first and second groups which will correspond in location to locations of first-fourth vertical structures to be described below (i.e., the through-holes 14 on the left sides of FIGS. 5A and 5B will correspond to first and third vertical structures to be described below and the through-holes 14 on the right sides of FIGS. 5A and 5B will correspond to second and fourth vertical structures to be described below). A pitch between neighboring through-holes 14 of the same grouping can exceed a pitch between corresponding through-holes 14 of neighboring groups.

Although the through-holes 14 are illustrated and are described herein as being arranged in a regular rectangular formation, it is to be understood that this is not required and that other formations can be used. These include, but are not limited to, regular polygonal formations and irregular formations.

In accordance with embodiments of the invention, an upper limit of the number of the n interleaved nitride layers 10 and oxide layers 12 may be defined by multiple factors. These include, for example, one or more of an etch depth range of the ME, an etch aspect ratio of the RIE, capillary forces and compressive forces exerted on lower ones of the nitride layers 10 and the oxide layers 12 by a total weight of the overlying nitride layers 10 and the oxide layers 12. For purposes of clarity and brevity, the number of the n interleaved nitride layers 10 and the oxide layers 12 above and below the reinforcing layer 13 can be sixty-four but it is to be understood that the number of the n interleaved nitride layers 10 and then oxide layers 12 can be fewer or substantially larger than sixty-four.

With reference to FIGS. 6A and 6B, the through-holes 14 are lined with poly-silicon or another similar material and filled with oxide to form posts 140.

With reference to FIGS. 7A and 7B, portions of the n interleaved nitride layers 10 and oxide layers 12 above the reinforcing layer 13 are etched to form third and fourth vertical structures 15 and 16 over first and second sections 110 and 111 of the substrate 11. The portions of the n interleaved nitride layers 10 and the oxide layers 12 can be defined as being remote from the first and second sections 110 and 111. The etchant used is selective to the materials of the nitride layers 10 and the oxide layers 112 such that the reinforcing layer 13 is unaffected by the etch process. A location of the first section 110 is determined and chosen to define a location of the first and third vertical structures to be described below and a location of the second section 111 is determined and chosen to define a location of the second and fourth vertical structures to be described below. A distance between the first section 110 and the second section 111 can be established in accordance with a desired pitch of the resulting VNAND structure, in accordance with an expected strength of reinforcing layer bridges to be described below and in accordance with additional factors, such as a possibility of processing defects resulting from the space between the first and second sections 110 and 111 being too small or too large.

With reference to FIGS. 8A and 8B, portions of the reinforcing layer 13 are etched to form reinforcing layer sheets 130 and reinforcing layer bridges 131. The reinforcing layer sheets 130 are disposed to lie underneath the third and fourth vertical structures 15 and 16 (and to lie over and across the first and second vertical structures to be described below). The etchant used is selective to the materials of the reinforcing layer 13 such that the n interleaved nitride layers 10 and oxide layers 12 in the third and further vertical structures 15 and 16 and the n interleaved nitride layers 10 and oxide layers 12 underneath the reinforcing layer 13 are unaffected by the etch process. The reinforcing layer sheets 130 can have a similar shape as that of the third and fourth vertical structures 15 and 16. The reinforcing layer bridges 131 extend between corresponding reinforcing layer sheets 130 and can be uniformly or uniquely separated from one another based on the desired architecture and the required amount of stability from the reinforcing layer bridges 131. That is, if the desired architecture is expected to require a substantial amount of stability, a relatively high number of reinforcing layer bridges 131 will be needed and those reinforcing layer bridges 131 will need to be relatively close to one another. By contrast, if the desired architecture is expected to require a limited amount of stability, a relatively low number of reinforcing layer bridges 131 will be needed and those reinforcing layer bridges 131 could be relatively distant from one another.

With reference to FIGS. 9A and 9B, portions of the n interleaved nitride layers 10 and oxide layers 12 below the reinforcing layer 13 are etched to form first and second vertical structures 17 and 18 over the first and second sections 110 and 111 of the substrate 11. The portions of then interleaved nitride layers 10 and the oxide layers 12 can be defined such that the first and second vertical structures 17 and 18 correspond in shape, size and position as those of the third and fourth vertical structures 15 and 16. The etchant used can be the same etchant used to form the third and fourth vertical structures 15 and 16.

As a result of the processing described above, a reinforced VNAND structure 901 is provided. As shown in FIGS. 9A and 9B, the reinforced VNAND 901 includes a first set of interleaved oxide and nitride layers formed into the first and second vertical structures 17 and 18, a reinforcing layer formed of one or more of silicon oxide, silicon nitride, hafnium and aluminum oxide that includes the reinforcing layer sheets 130 and the reinforcing layer bridges 131 and a second set of interleaved oxide and nitride layers formed into the third and fourth vertical structures 15 and 16. The first vertical structure 17 rises from the first section 110 of the substrate 11 and the second vertical structure 18 rise from the second section 111 of the substrate 11. The reinforcing layer sheets 130 are distinct from one another and are laid across respective tops of the first and second vertical structures 17 and 18. The reinforcing layer bridges 131 are disposed and configured to connect the reinforcing layer sheets 130. The third vertical structure 15 rises from the reinforcing layer sheet 130 corresponding to the first vertical structure 17 and the fourth vertical structure 16 rises from the reinforcing layer sheet 130 corresponding to the second vertical structure 18. Each of the first-fourth vertical structures 15-18 includes a post 140 of oxide lined with polysilicon.

The respective numbers of the oxide and nitride layers in at least the first and second vertical structures 17 and 18 are the same and the first and second vertical structures 17 and 18 and the third and fourth vertical structures 15 and 16 can have a number of layers that is limited by a weight of the layers and an etch depth range for the etching of the through-holes 14, for example.

As shown in FIG. 9B, the reinforced VNAND structure 901 can include additional reinforcing layers 910 and additional sets of interleaved oxide and nitride layers formed into additional third and additional fourth vertical structures 911 and 912. These additional features can be disposed on the third and fourth vertical structures 15 and 16 and can be formed similarly as described above or in a post-processing assembly process.

Figure 10A:
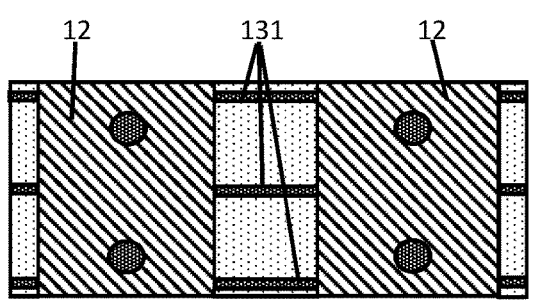
FIG. 10A is a top view of the first-fourth vertical structures following an etching process to remove nitride layers in accordance with embodiments of the invention.
Figure 10B:
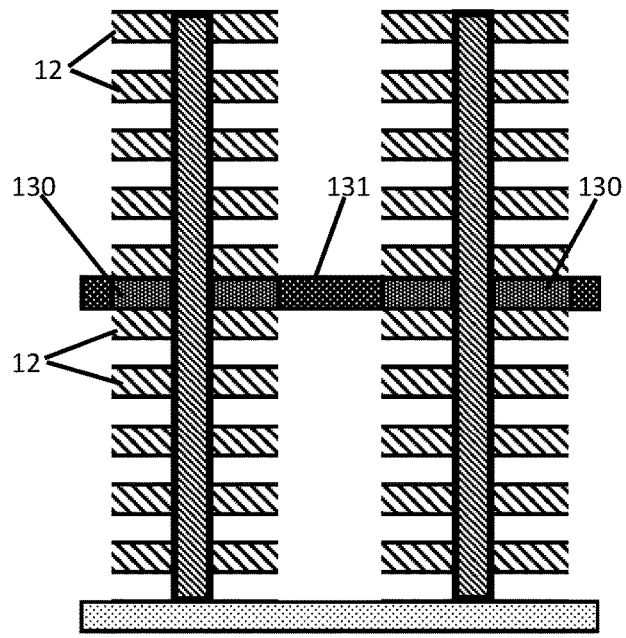
FIG. 10B is a side view of the first-fourth vertical structures following the etching process to remove the nitride layers in accordance with embodiments of the invention.

With reference to FIGS. 10A and 10B, an etching process is executed to remove the nitride layers 10 from the first-fourth vertical structures 15-18.

Figure 11A:
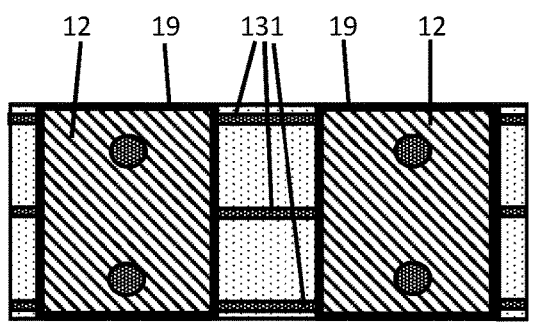
FIG. 11A is a top view of the first-fourth vertical structures with the oxide layers being lined in accordance with embodiments of the invention.
Figure 11B:
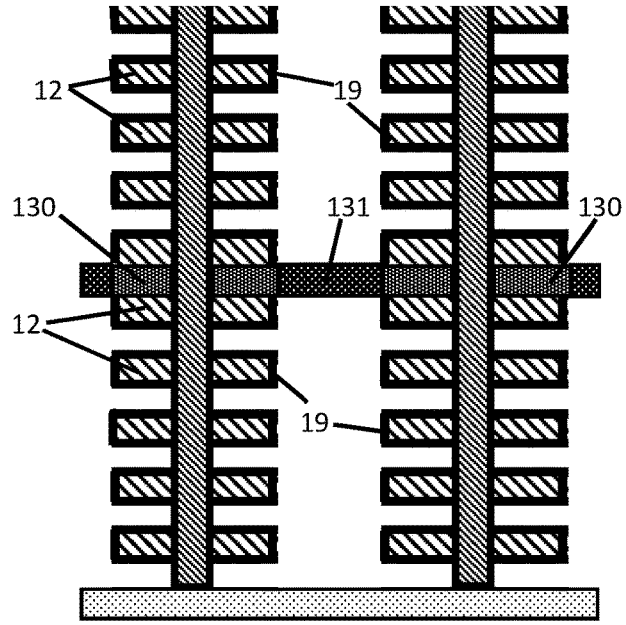
FIG. 11B is a side view of the first-fourth vertical structures with the oxide layers being lined in accordance with embodiments of the invention.

With reference to FIGS. 11A and 11B, exposed surfaces of the oxide layers 12 of the first-fourth vertical structures 15-18 are lined with a lining 19 of, for example, a silicon nitride trap layer and a dielectric or blocking layer. The materials of the lining 19 can be deposited in a chemical vapor deposition (CVD) process or another similar process.

With reference to FIGS. 12A and 12B, metallic material 20 is deposited around the oxide layers 12 of the first-fourth vertical structures 15-18 and the lining 19. The metallic material 20 may be tungsten or another similar material and may be formed to define a trench 201 between the third and fourth vertical structures 15 and 16 and between upper portions of the first and second vertical structures 17 and 18.

With reference to FIGS. 13A and 13B, the metallic material 20 and the reinforcing layer bridges 131 are etched such that the remaining metallic material 20 has a similar shape and size as the reinforcing layer sheets 130 and is provided as metallic layers interleaved with the lined oxide layers.

As a result of the processing described above, a reinforced VNAND structure 1301 is provided. As shown in FIGS. 13A and 13B, the reinforced VNAND structure 1301 includes a first set of interleaved lined oxide and metallic layers formed into the first and second vertical structures 17 and 18, a reinforcing layer formed of one or more of silicon oxide, silicon nitride, hafnium oxide and aluminum oxide that includes the reinforcing layer sheets 130 and a second set of interleaved lined oxide and metallic layers formed into the third and fourth vertical structures 15 and 16. The first vertical structure 17 rises from the first section 110 of the substrate 11 and the second vertical structure 18 rise from the second section 111 of the substrate 11. The reinforcing layer sheets 130 are distinct from one another and are laid across respective tops of the first and second vertical structures 17 and 18. The third vertical structure 15 rises from the reinforcing layer sheet 130 corresponding to the first vertical structure 17 and the fourth vertical structure 16 rises from the reinforcing layer sheet 130 corresponding to the second vertical structure 18. Each of the first-fourth vertical structures 15-18 includes a post 140 of oxide lined with poly-silicon.

The respective numbers of the lined oxide and metallic layers in at least the first and second vertical structures 17 and 18 are the same and the first and second vertical structures 17 and 18 and the third and fourth vertical structures 15 and 16 can have a number of layers that is limited by a weight of the layers and an etch depth range for the etching of the through-holes 14, for example.

As shown in FIG. 13B, the reinforced VNAND structure 1301 can include additional reinforcing layers 1310 and additional sets of interleaved lined oxide and metallic layers formed into additional third and additional fourth vertical structures 1311 and 1312. These additional features can be disposed on the third and fourth vertical structures 15 and 16 and can be formed similarly as described above or in a post-processing assembly process.

Although the description provided herein and the illustrations of FIGS. 1A-13B relate to embodiments in which two stacks of vertical structures are provided, it is to be understood that other embodiments exist and are within the scope of this description. For example, more than two stacks of vertical structures can be provided with the reinforcing layer 13 of FIG. 9B extending through all of them. Similarly, multiple sets of two or more stacks of vertical structures can be provided with discrete reinforcing layers 13 as shown in FIG. 9B extending through each of them, respectively. Still further, reinforcing layers (such as reinforcing layer 13 and additional reinforcing layer 910) can be provided between two or more sets of two or more stacks of vertical structures in a pyramidal or checkered formation.

For the sake of brevity, conventional techniques related to semiconductor device and integrated circuit (IC) fabrication can or cannot be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching (e.g., selective etching and RIE or directional and isotropic etching) is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

What is claimed is:

1. A method of assembling a reinforced-NAND structure, the method comprising:
    disposing a first set of interleaved oxide and nitride layers on a substrate with first and second sections;
    laying a reinforcing layer over the first set of the interleaved oxide and nitride layers;
    disposing a second set of interleaved oxide and nitride layers on the reinforcing layer;
    forming the second set of the interleaved oxide and nitride layers into third and fourth vertical structures rising from the reinforcing layer and corresponding to the first and second sections, respectively;
    forming the reinforcing layer into first and second sheets, which are distinct in boundary from one another
    forming bridges connecting the first and second sheets in and only in a plane of the first and second sheets;
    and forming the first set of the interleaved oxide and nitride layers into first and second vertical structures rising from the substrate and corresponding to the first and second sections, respectively,
    wherein the first sheet is interposed between the third and first vertical structures and the second sheet is interposed between the fourth and second vertical structures.

2. The method according to claim 1, wherein:
    the disposing of the first and second sets of the interleaved oxide and nitride layers comprises alternately depositing nitride and oxide,
    the forming of the first and second set of the interleaved oxide and nitride layers into the first and second and third and fourth vertical structures comprises etching portions of the oxide and nitride between the first and second sections of the substrate, and
    the forming of the reinforcing layer comprises depositing one or more of silicon oxide, silicon nitride, hafnium oxide and aluminum oxide and etch-forming the bridges.

3. The method according to claim 2, wherein the forming of the first and second sets comprises supporting the first, second, third, and fourth vertical structures with an oxide post lined with poly-silicon.

4. The method according to claim 1, further comprising:
    laying an additional reinforcing layer over the second set of the interleaved oxide and nitride layers;
    disposing an additional set of interleaved oxide and nitride layers on the additional reinforcing layer;
    forming the additional set of the interleaved oxide and nitride layers into additional third and fourth vertical structures rising from the additional reinforcing layer and corresponding to the first and second sections, respectively;

forming the additional reinforcing layer into additional first and second sheets, which are distinct in boundary from one another; and forming additional bridges connecting the additional first and second sheets in and only in respective planes of the first and second sheets, wherein the additional first sheet is interposed between the third and the additional third vertical structures and the second sheet is interposed between the fourth and the additional fourth vertical structures.

5. A method of assembling a reinforced-NAND structure, the method comprising:

building, on first and second sections of a substrate, a structure comprising a reinforcing layer interposed between first and second sets of interleaved oxide and nitride layers;

etching portions of the second set of interleaved oxide and nitride layers between the first and second sections of the substrate using an etchant that is selective to materials of the second set of the interleaved oxide and nitride layers such that the reinforcing layer is unaffected by the etching;

etching the reinforcing layer to form distinct sheets, which are distinct in boundary from one another, using an etchant that is selective to materials of the reinforcing layer such that the first set and remainders of the second set of the interleaved oxide and nitride layers are unaffected by the etching;

etch-forming bridges between the distinct sheets to connect the distinct sheets in and only in a respective plane of the distinct sheets; and etching portions of the first set of interleaved oxide and nitride layers between the first and second sections of the substrate.

6. The method according to claim 5, wherein the building further comprises forming oxide posts lined with polysilicon in the oxide, nitride and reinforcing layers.

7. The method according to claim 5, wherein the building comprises forming sixty-four layers below the reinforcing layer.

8. The method according to claim 5, wherein a material of the reinforcing layer comprises one or more of silicon oxide, silicon nitride, hafnium oxide and aluminum oxide.

9. The method according to claim 5, further comprising:

building additional reinforcing layers for interposition between additional sets of interleaved oxide and nitride layers; and repeating the etching for the additional reinforcing layers and the additional sets of interleaved oxide and nitride layers.

10. The method according to claim 5, further comprising:

removing the nitride layers;

lining exposed surfaces of the oxide layers;

depositing metallic material around the lining; and etching the metallic material.

\* \* \* \* \*